(12) United States Patent
Eckenrode

(10) Patent No.: US 6,499,198 B2
(45) Date of Patent: Dec. 31, 2002

(54) RETAINING CLIP FOR COMPUTER EXPANSION CARD

(75) Inventor: Robert T. Eckenrode, North Canton, OH (US)

(73) Assignees: Trans Technology Engineered Componenets, LLC, Brunswick, OH (US); National City Bank, Cleveland, OH (US)

(*) Notice: Subject to any disclaimer, the term of this patent is extended or adjusted under 35 U.S.C. 154(b) by 0 days.

(21) Appl. No.: 09/841,315

(22) Filed: Apr. 24, 2001

(65) Prior Publication Data

US 2001/0049864 A1 Dec. 13, 2001

Related U.S. Application Data

(63) Continuation-in-part of application No. 09/589,412, filed on Jun. 7, 2000, now Pat. No. 6,401,311.

(51) Int. Cl.[7] .................. A44B 21/00; B42F 1/00; E05C 9/00; H05K 7/12
(52) U.S. Cl. .................. 24/295; 24/293; 24/458; 292/17; 361/683
(58) Field of Search .................. 24/295, 293, 289, 24/458

(56) References Cited

U.S. PATENT DOCUMENTS

| | | | | |
|---|---|---|---|---|
| 4,683,622 A | * | 8/1987 | Oehlke | 24/295 |
| 4,710,852 A | * | 12/1987 | Keen | 24/295 |
| 4,745,524 A | * | 5/1988 | Patton, III | 361/395 |
| 5,004,867 A | * | 4/1991 | Mast | 174/35 GC |
| 5,011,418 A | * | 4/1991 | Perzentka, Jr. | 439/135 |
| 5,076,619 A | * | 12/1991 | Chi | 292/17 |
| 5,101,540 A | * | 4/1992 | Roof et al. | 24/293 |
| 5,201,669 A | * | 4/1993 | Lin | 439/357 |
| 5,601,349 A | * | 2/1997 | Holt | 312/265.6 |
| 5,694,291 A | * | 12/1997 | Feightner | 364/708.1 |
| 5,820,171 A | * | 10/1998 | Albani et al. | 292/17 |
| 5,947,571 A | * | 9/1999 | Ho | 312/265.6 |

FOREIGN PATENT DOCUMENTS

| | | | | |
|---|---|---|---|---|
| AU | 0124540 | * | 1/1946 | 24/295 |
| AU | 0256166 | * | 10/1963 | 24/295 |
| FR | 1562236 | * | 4/1969 | 24/295 |
| GB | 0840556 | * | 7/1960 | 24/295 |

* cited by examiner

*Primary Examiner*—Victor Sakran
(74) *Attorney, Agent, or Firm*—Vytas R. Matas

(57) ABSTRACT

An integral spring clip and computer slot cover is disclosed for mounting over an expansion slot of a PC. The cover has an integrally formed spring clip assembly for capturing a ledge of the PC case over an expansion slot therein at one end and means formed at an opposite end of said cover assembly for retaining that end of said cover assembly to the computer case to allow either a slot cover to be mounted over the slot without the use of screws or to mount an expansion card therein by mounting the card through an opening formed in the cover assembly.

5 Claims, 6 Drawing Sheets

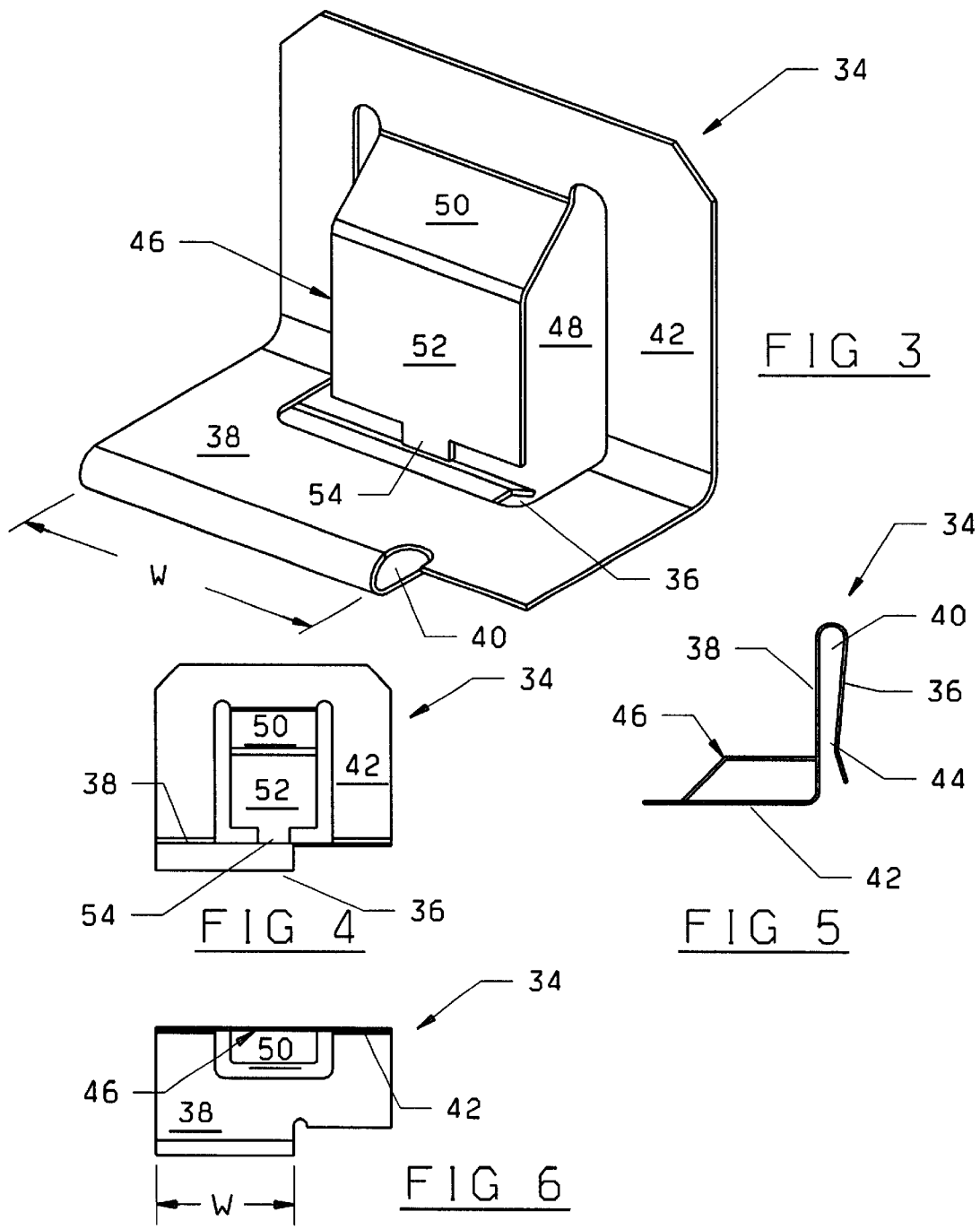

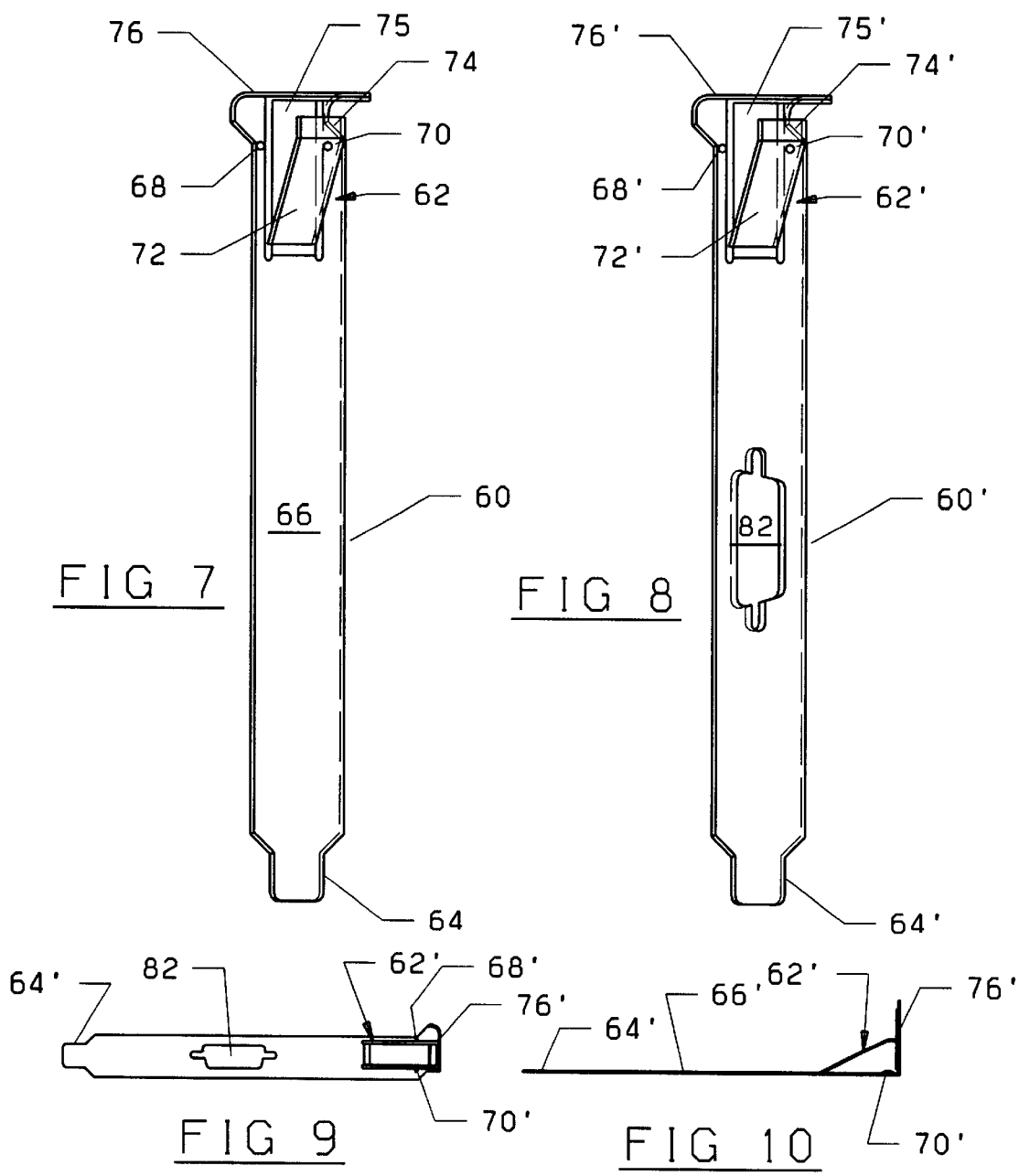

RETAINING CLIP FOR COMPUTER EXPANSION CARD

This application is a continuation-in-part of Ser. No. 09/589,412, filed Jun. 7, 2000 now U.S. Pat. No. 6,401,311.

BACKGROUND OF THE INVENTION

1. Field of the Invention

The present invention relates to mounting PC (personal computer) expansion cards or covers into computer case slots provided for same and more particularly to clips for easing such mountings by obviating the need for screws to retain the expansion cards or covers on said slot.

2. Description of the Prior Art

Most PCs are bought with a limited number of functions. Extra functions such as modems, sound cards, math co-processor cards etc. may be added later by inserting an expansion card having the desired function into an expansion slot found at the back of the PC case. This expansion slot may be vertical or horizontal and is usually covered with a blank cover screwed to the PC case.

Referring to FIG. 1 it will be seen that the typical PC case (10) has a series of expansion slots (12) formed at the rear (14) of the PC case (10). These slots (12) extend from a ledge (16) and have a top opening (18) perpendicular to the slots (12). A series of circular holes (20) are centrally located at the end of each top opening (18). The opening (18, 12) are usually covered with blank covers (22) having a narrow tip (24) and a right angle leg (26) with a hole (28) therein. The tip (24) is inserted into a slot (30) with the cover (22) extending over opening (12) and the leg (26) extending over opening (18) and with the hole (28) being aligned with the ledge hole (20). A screw (32) is screwed into the ledge (18) through the hole (28) and may be extended to the hole (20) to positively lock the cover (22) over the expansion slot (12). This procedure is done for all the expansion holes in the initial manufacture of the PC.

When an expansion card (34) is needed, one cover (22) is removed from the conforming expansion slot and the expansion card (34) is located therein. Since the card (34) is typically mounted to a cover plate similar in construction to the plate (22) the prime numbering has been retained for similar parts of the expansion card and the blank cover. The insertion of the card (34) and cover (22') is as was described earlier for cover (22).

Since the holes (28, 20) are small, as is the screw (28), alignment and threading of the screw (28) into the aligned holes is time consuming and difficult with the screw usually falling into the PC case components and having to be fished out of there.

What the prior art lacked was a simple method of retaining expansion cards and blank covers in the PC case.

SUMMARY OF THE INVENTION

The present invention solves the problems associated with prior art cover retaining means and others by providing two different types of clips for retaining an expansion card or a blank cover in the computer case without the use of screws. In one embodiment a clip mountable to the PC case is used for retaining either a prior art screw type blank cover (22) or an expansion card (34) for the PC over an expansion slot by snapping a flexible tip of the PC clip into the screw hole found in both prior art blank covers and expansion cards.

In a second embodiment the clip is made integral with the blank cover or expansion card. The clip includes a spring leg portion formed from the elongated clip body at the top of the clip but below the angled short leg portion of the clip to allow the clip to capture the computer case between the short leg portion and the spring leg portion. The spring leg portion presses against the computer case and is disengaged by pushing it forward from engagement with a tool inserted through a slot in the clip.

In view of the foregoing it will be seen that one aspect of the present inventions is to provide a means for mounting a PC expansion card or expansion slot cover over an expansion slot in the PC without the use of screws.

Another aspect is to provide a clip, which is easily mounted to a PC case to retain either PC expansion cards or blank expansions slot covers during the initial manufacture of the PC.

Yet another aspect is to provide an integral clip and expansion card cover, which is easily mounted to a PC case without the use of screws.

Still yet another aspect is to provide an integral clip and blank expansion slot cover which is easily mounted to a PC case without the use of screws.

These and other aspects of the present invention will be more fully understood after a review of the following description of the preferred embodiment when considered with the accompanying drawings.

BRIEF DESCRIPTION OF THE DRAWINGS

In the drawings:

FIG. 3 is a perspective view of the PC clip of the present invention;

FIG. 4 is a front view of the PC clip of FIG. 3;

FIG. 5 is a side view of the PC clip of FIG. 3;

FIG. 6 is a top view of the PC clip of FIG. 3;

FIG. 7 is a perspective view of the integral clip and blank expansion slot cover of the present invention;

FIG. 8 is a perspective view of the integral clip having a cutout for an expansion card to be mounted therein;

FIG. 9 is a top view of the integral clip of FIG. 8;

FIG. 10 is a side view of the FIG. 8 clip;

DESCRIPTION OF THE PREFERRED EMBODIMENT

Figure 1:
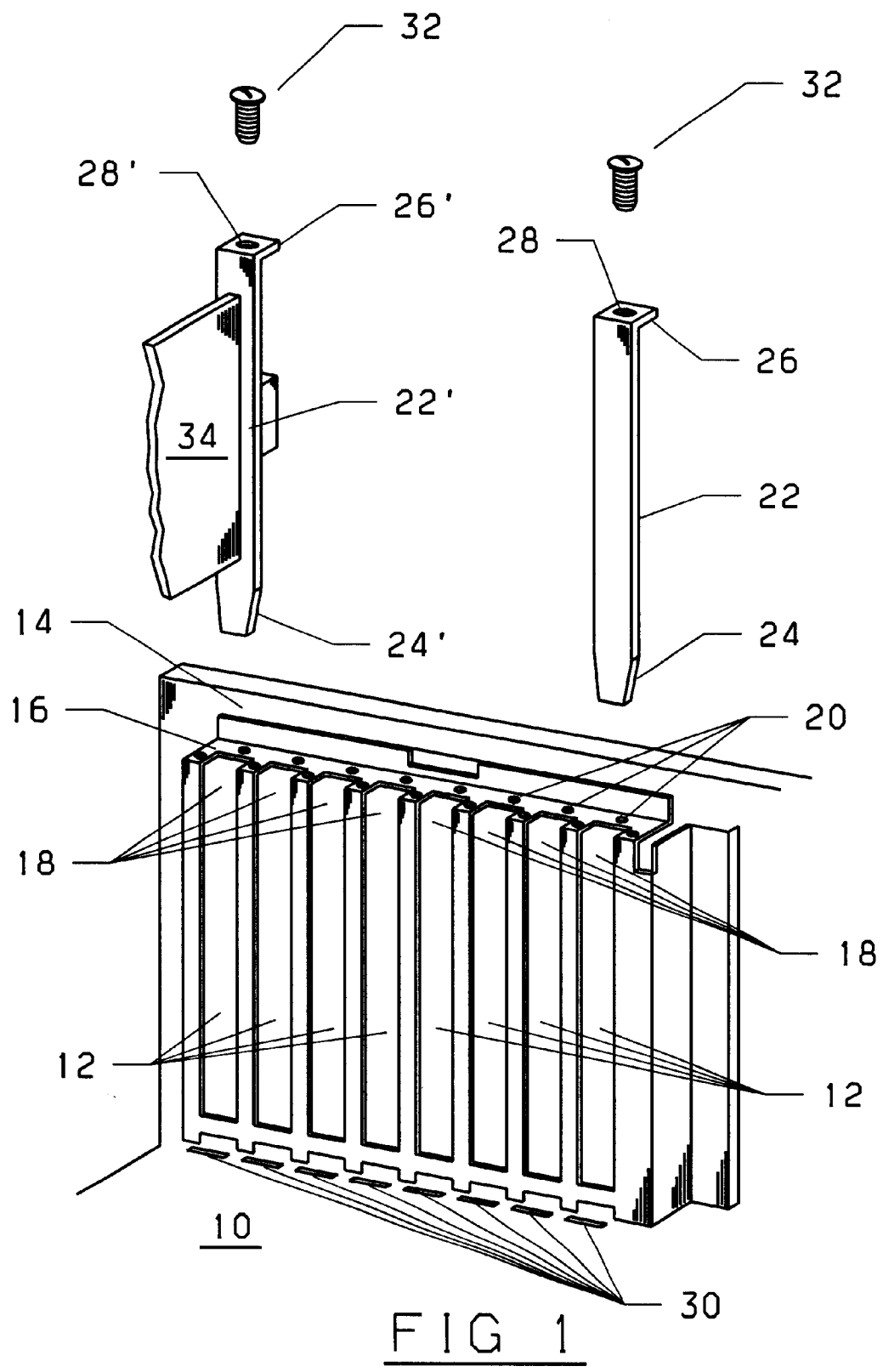
FIG. 1 is a perspective view of prior art PC expansion card and expansion slot cover mountings.
Figure 2:
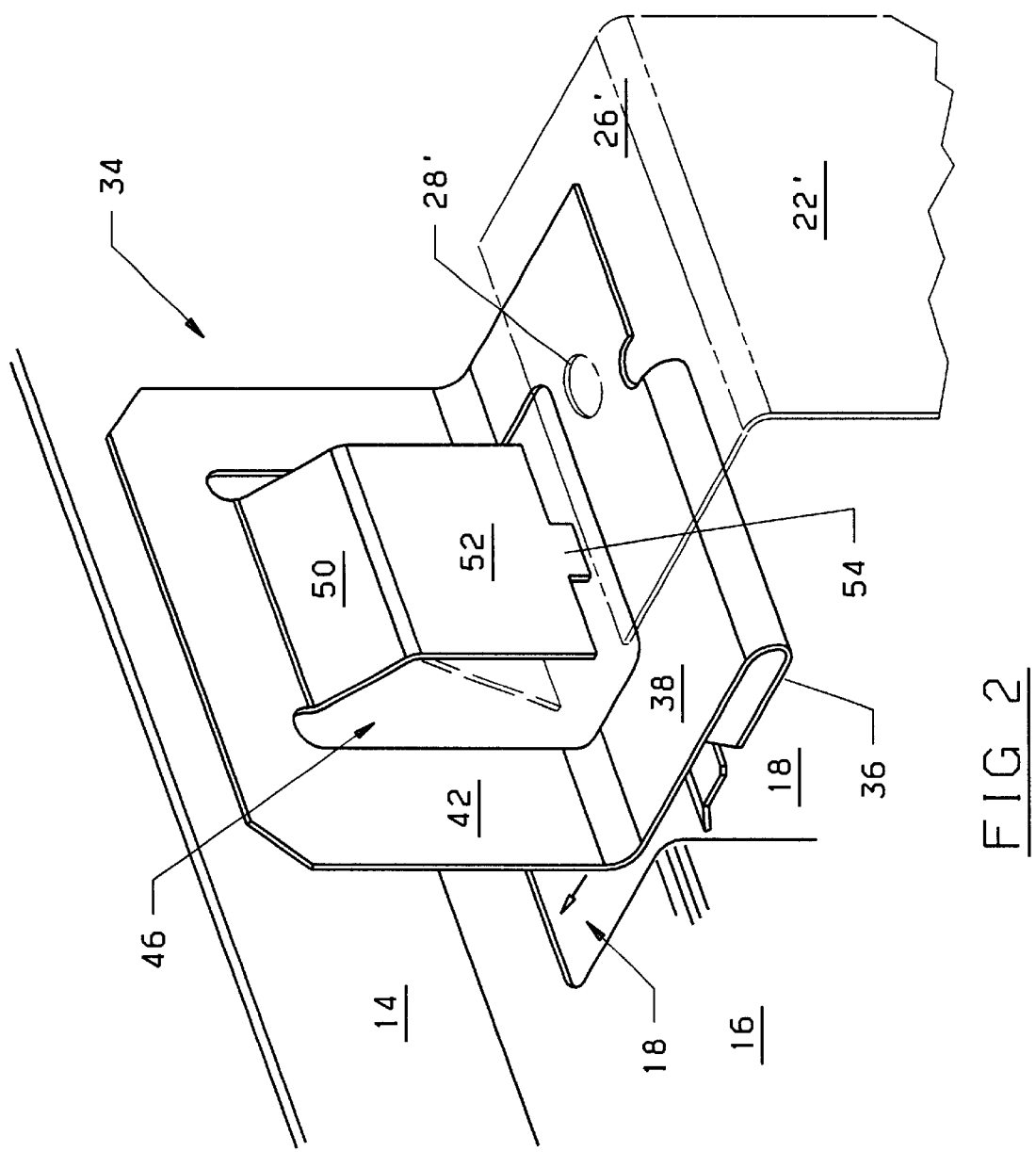
FIG. 2 is an expanded perspective view of the PC clip of the present invention mounted to a PC case for retaining either a PC expansion card or expansion slot cover.

Referring now to FIGS. 2–6, one embodiment of a computer expansion slot clip is shown which requires no screws to mount the clip to the computer case. It will be understood that while the reference is to a single slot cover or PC clip (35), a plurality of same could be mounted to a plurality of expansion slots in a similar manner.

The clip (35) has a curved portion (36) folded back over a top ledge portion (38) to form a pocket (40) there between for retaining the ledge (16) portion of the PC case (14) directly behind one of the openings (18). A backplate (42) extends at a right angle up from the ledge portion (38) and is made to rest up against the PC case (14) with the ledge

(16) open portion extended inside the pocket (40). The curved portion (36) has an angled tip (44) formed therein angled to bend down when the ledge (16) is inserted into the pocket (40) to be easily fitted into the pocket (40). However, the tip (44) will be bent up with any attempt to remove the ledge (16) from the pocket (40) causing interference for any attempted removal of the ledge (16).

The width W of the pocket (40) is made to be the same or slightly smaller than the width of the openings (18) to allow the capture of the ledge (16) portion behind the opening (18).

A flexible wing portion (46) is formed from the back plate portion (42) and the ledge portion (38) leaving a right angle opening (48) therein. The wing portion (46) is formed as an angled portion (50) having a straight leg portion (52) extending down therefrom and having a tab (54) at the end of the straight leg (52). The angled portion (50) extends away from the backplate portion (42) sufficiently to have the tab (54) align with one of the holes (20) when the clip (35) is properly fitted to the case (14).

Now, with the PC clip (35) properly installed, either during initial manufacture of the PC or as a retrofit, when either a blank cover plate (22) or a PC expansion card (22') is installed into one of the openings (12) having a clip (34) mounted therein, the leg portion (26, 26') is aligned to have the tab (54) in line with the opening (28,28'). It is then pushed against the straight leg portion (52) moving it back until the restoring force of the spring in the flexible member (46) overcomes the pushing force and the tab (54) is pushed into the opening (28,28') which is aligned with one of the holes (20). To disengage, the leg portion (52) may be raised out of the hole (28) releasing the cover plate or expansion card (22,22'). Alternately, the card or plate may be forced back until the tab is disengaged from the hole.

Referring now to FIGS. 7–12 generally, a second embodiment of the computer clip is shown. This embodiment provides a one piece or integral clip and expansion slot cover again requiring no screws to fasten it to the computer case.

Referring now to FIG. 7, an integral computer expansion slot cover (60) is shown which is similar to the prior art slot cover (22) except that it uses an integral clip assembly (62) to mount the cover to the computer case (14) instead of the screws (32). The slot cover (60) has a bottom leg portion (64), which is fitted into an opening (30) to cover one slot (12). The body (66) is then swung up toward the opening (12) until the assembly (62) is clamped onto the ledge (16) of the computer case (14). The cover (60) has a pair of dimples (68;70) near the top of the cover (60), which fit into the edges of the opening (12) to position the cover properly over the slot (12). The clip assembly (62) comprises a flexible tab member (72) formed from the body (66) of the cover (60) to have a bent leading edge (74) which allows easy insertion of a top tab (76) of the clip (60) to easily fit over the top of the ledge (16) of the case (14) with the tab (74) fitting under the ledge (16). To release the clip (60), the tab member (72 must be pushed back with a screwdriver tip extended through an opening (75) to disengage the ledge (16) and allow the clip (60 to be removed.

Turning to FIGS. 8–12, the clip (60) is shown to be modified to mount an expansion card (78) having an external to the computer case signal connection (80) mounted thereto. To accomplish this, a cutout (82) is formed in the body (66) of the cover (60). Since the operation of this modified cover is identical to the previously described cover (60) identical parts of this modified cover (60') will be identified with a prime of the previous number used for the cover (60).

Figure 11:
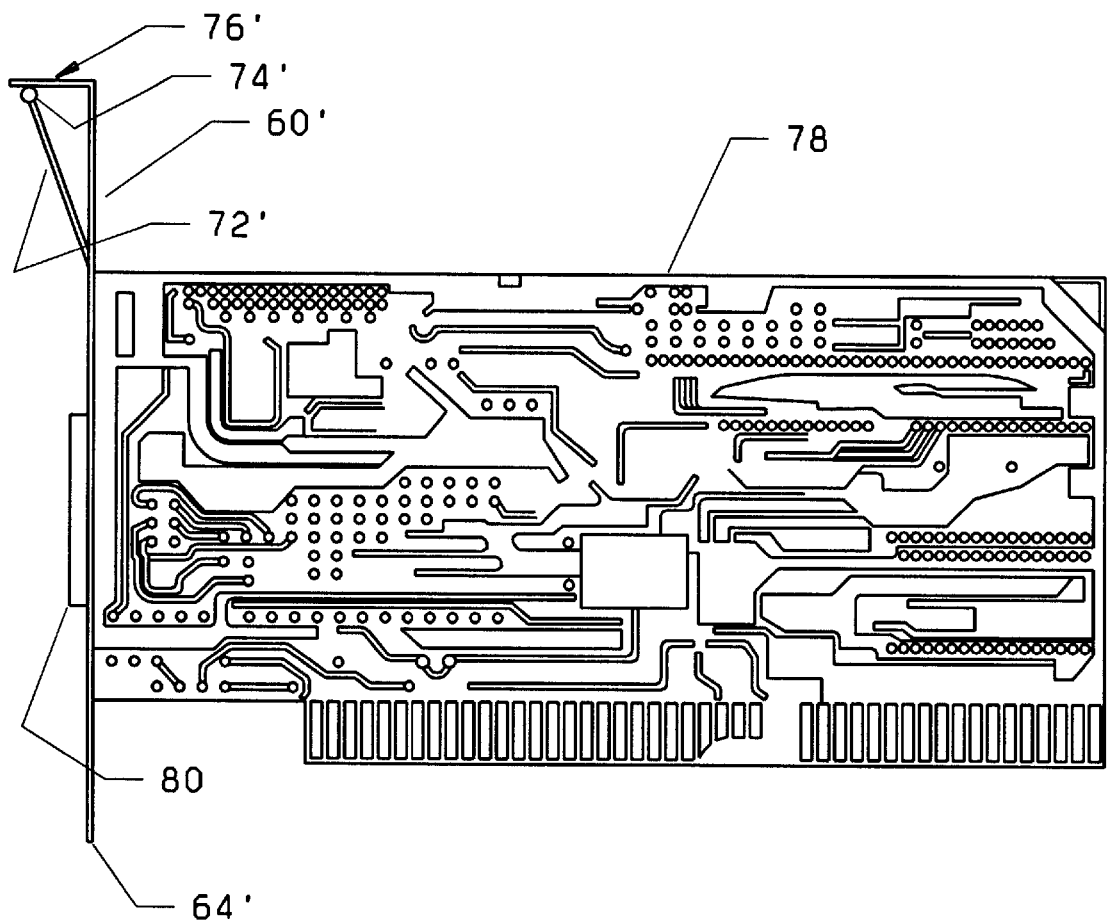
FIG. 11 is a side view of the FIG. 8 clip having an expansion board mounted thereto.
Figure 12:
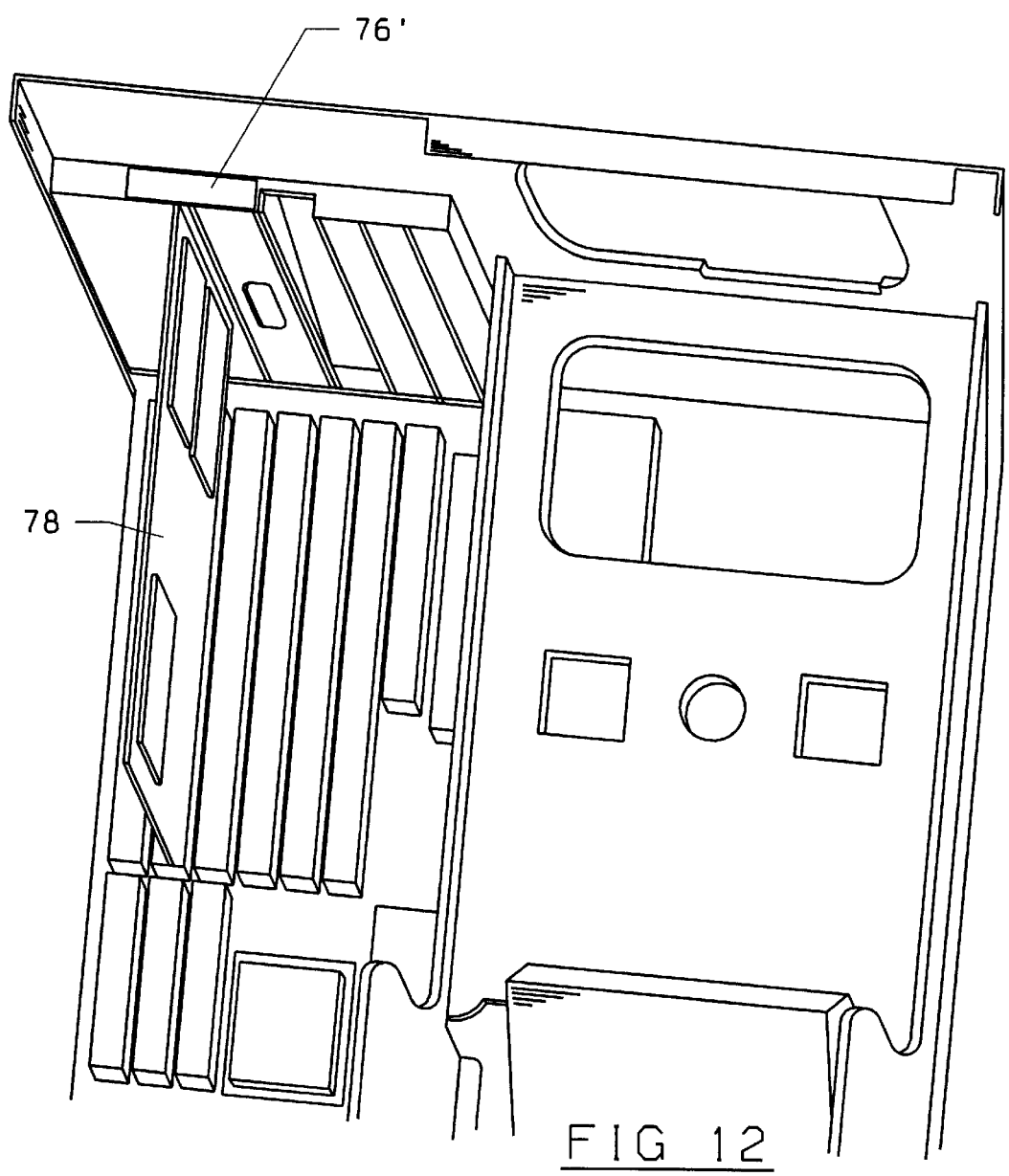
FIG. 12 is a perspective view of the FIG. 11. clip mounted to a computer case.

As can be best seen in FIGS. 11–12, the expansion card (78) is maintained inside the computer case while the signal connection (80) is external thereto when the cover (60') is snapped into the computer case over the proper expansion slot.

Certain modifications and additions will occur to those skilled in the art area upon reading this disclosure. It will be understood that all such were deleted herein for the sake of conciseness and readability but are intended to fall within the scope of the following claims.

As an example, the clip (35) can be fitted to expansion slots having no holes (20) in the case area around the slot (18) and will still capture expansion cards and slot covers which are formed with a hole for mounting to the expansion slot with a screw. Also, it may be possible to form the covers (60;60") from an appropriate plastic material having sufficient strength and flexibility for the tab (74;74').

What is claimed is:

1. An integral spring clip and computer slot cover mountable over an expansion slot of a PC comprising:

a cover assembly for covering an expansion slot of a computer case;

said cover assembly having an integrally formed spring clop assembly for capturing a ledge of the PC case over an expansion slot therein;

means formed at an end of said cover assembly opposite said spring clip assembly for retaining that end of said cover assembly to the computer case; and a flexible tab formed from the main body of said cover assembly and extending out there from at one end thereof and having a bent leading edge for sliding along a bottom of a computer slot ledge.

2. An integral cover assembly as set forth in claim 1 including a top ledge portion fitting over the top of said computer slot ledge to capture one end of said cover assembly to said computer slot.

3. An integral cover assembly as set forth in claim 2 wherein said means formed at the opposite end of said cover assembly includes a tab portion fitting into an opening at a bottom of said computer slot, to mount the opposite end of said cover assembly thereto.

4. An integral cover assembly as set forth in claim 3 including a pair of dimples located opposite one another at one end of said cover assembly for locating said cover assembly over an expansion slot by fitting therein.

5. An integral cover assembly as set forth in claim 4 including an opening formed in said body of said cover assembly for locating a signal connecting portion of an expansion card there through.

* * * * *